United States Patent [19]
Won

[11] Patent Number: 5,767,798
[45] Date of Patent: Jun. 16, 1998

[54] MODULATION CODE ENCODER AND/OR DECODER

[75] Inventor: Yong-kwang Won, Kyungki-do, Rep. of Korea

[73] Assignee: Samsung Electronics Co., Ltd., Kyungki-do, Rep. of Korea

[21] Appl. No.: 684,213

[22] Filed: Jul. 19, 1996

[30] Foreign Application Priority Data

Jul. 20, 1995 [KR] Rep. of Korea ............ 95-21404

[51] Int. Cl.$^6$ .................................................. H03M 7/00
[52] U.S. Cl. .................................................. 341/59; 341/95
[58] Field of Search .................................. 341/50, 59, 67, 341/95

[56] References Cited

U.S. PATENT DOCUMENTS

| | | | |
|---|---|---|---|
| 4,413,251 | 11/1983 | Adler et al. | 341/59 |
| 4,672,362 | 6/1987 | Furukawa et al. | 341/67 |
| 5,184,215 | 2/1993 | Weng | 341/59 |
| 5,400,023 | 3/1995 | Ino et al. | 341/59 |
| 5,486,828 | 1/1996 | Mikami | 341/59 |
| 5,579,003 | 11/1996 | Hirayama et al. | 241/59 |

*Primary Examiner*—Marc S. Hoff
*Attorney, Agent, or Firm*—Sughrue, Mion, Zinn, Macpeak & Seas, PLLC

[57] ABSTRACT

Modulation code encoder/decoder for a (2,9) RLL modulation code are provided. The modulation code encoder includes a serial-to-parallel converter, a controller, an inverter, a first and second memory and a multiplexer, and the modulation code decoder includes a serial-to-parallel converter, a controller, an inverter, a first and second memory, a first multiplexer, a delay circuit, a selection signal output portion, a second multiplexer and a parallel-to-serial converter. The modulation code encoder/decoder can be applied to a magneto-optical disk, magnetic tape and hard disk drive (HDD) in which high-density recording is required since the error correction capacity is enhanced by providing a decoder which performs an overlapped decoding operation with respect to the (2,9) RLL modulation code.

13 Claims, 3 Drawing Sheets

MODULATION CODE ENCODER AND/OR DECODER

BACKGROUND OF THE INVENTION

The present invention relates to a modulation code encoder and/or decoder which is suitable for a magnetic tape, magneto-optical disk, and a hard disk drive, and more particularly, to a modulation code encoder and/or decoder for encoding and decoding a (2,9) run-length limited (RLL) modulation code.

Generally, RLL modulation is performed so as to record a digital signal on a recording media such as magnetic tape, magneto-optical disk or hard disk drive (HDD) with a high recording density. The RLL code used for the RLL modulation has a predetermined number of zeroes between adjacent 1s of a code bit sequence. Here, the minimum number of zeroes for preventing inter-symbol interference is represented by d, and the maximum number of zeroes is represented by k for self-clocking. This type of code is called (d,k) RLL code. This RLL code maps m data bits into n code bits, wherein m should be less than n. Also, a density ratio (DR) is defined as $$\frac{m \times (d+1)}{n}$$

and an encoding ratio is defined as m/n. Thus, the RLL code may be considered a (d,k,m,n) code.

The RLL code, which has been widely used in commercial industry, includes an eight to fourteen modulation (EFM) code with (2,10,8,14) as (d,k,m,n), a (2,7) modulation code with (2,7,1,2) and a (1,7) modulation code with (1,7,2,3).

The EFM code, suggested by Phillips, has been used in compact disk (CD) technology which is the most widely used optical disk system. However, since the EFM code requires an additional three bits for controlling a digital sum value (DSV), an encoding ratio decreases to 8/17 and a recording density ratio decreases to 24/17. Thus, the EFM code is not considered to be suitable for a high-density recording medium.

Also, even if the (2,7) code has a higher recording density ratio than the EFM code or (1,7) code, a complicated decoder is required and errors are propagated since the (2,7) code adopts a variable length encoding mode.

In the case of (1,7) RLL modulation code, the channel capacity thereof is close to the limit of the channel capacity, thereby providing high efficiency. However, the recording density ratio of the (1,7) RLL modulation code is 4:3. Thus, the modulation code is suitable for a magnetic disk or tape system while the recording density ratio thereof is slightly low for a high-density magneto-optical disk system.

Consequently, research into a high-density optical disk whose recording density is more than four times higher than that of the conventional CD has recently been actively undertaken, and standardization of the high-density optical disk has been suggested as a main issue in the electronic industry. Also, Toshiba Union developed a new efficient modulation (NEM) with (2,12,8,15) as (d,k,m,n), which has been applied to the high-density optical disk. However, even if the (8,15) code provides an excellent encoding ratio or recording density ratio compared with the conventional modulation codes and efficiently performs the DSV control, a complicated encoder is required. Thus, the NEM code is not suitable for the recording and reproducing systems.

Also, an EFM plus code suggested by Sony and Phillips has an encoding ratio of 8:16 while adopting the spectrum of the conventional EFM code, thereby providing a gain of 5.26%. However, the size of a codebook increases to more than two times the gain, and the structure of the encoder is complicated. Thus, the EFM plus code is not considered to be suitable for recording and reproducing systems.

SUMMARY OF THE INVENTION

To solve the above problem of the conventional code, it is an object of the present invention to provide a modulation code encoder for encoding (2,9) RLL modulation code.

It is another object of the present invention to provide a modulation code decoder for decoding the coded (2,9) RLL modulation code.

To accomplish the foregoing objects, the present invention provides a modulation code encoder for encoding (2,9) RLL modulation code having '0's, the amount of which lies in a range from two to nine, between adjacent '1's in a coded word sequence, which includes a serial-to-parallel converter which converts serial data of 4 bits or 2 bits into parallel data, first and second memories which respectively store a basic modulation code table and an additional modulation code table, a controller which selects one of the tables stored in the first and second memories to encode the parallel data, and a multiplexer for selecting either a basic modulation coded word, coded using the basic modulation code table, or an additional modulation coded word, coded using the additional modulation code table, in accordance with a selection signal output by the controller.

The present invention further provides a modulation code decoder for decoding (2,9) RLL modulation code having '0's, the amount of which lies in a range from two to nine, between adjacent '1's in a coded word sequence, which includes essentially the same elements as the encoder as well as a delay circuit for delaying a decoded word output from the first multiplexer by 1-reception bit clock period, a selection signal output unit which outputs a second selection signal for selecting one decoded word from the next block of eight-bit reception decoded data, after the decoded word is delayed, and a decoded word from the current block of eight-bit reception data output from the first multiplexer, a second multiplexer which outputs either the decoded word output from said delay circuit or the decoded word output from the first multiplexer according to the second selection signal output from said selection signal output unit, and a parallel-to-serial converter converts the decoded word output from the second multiplexer into a serial output signal.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
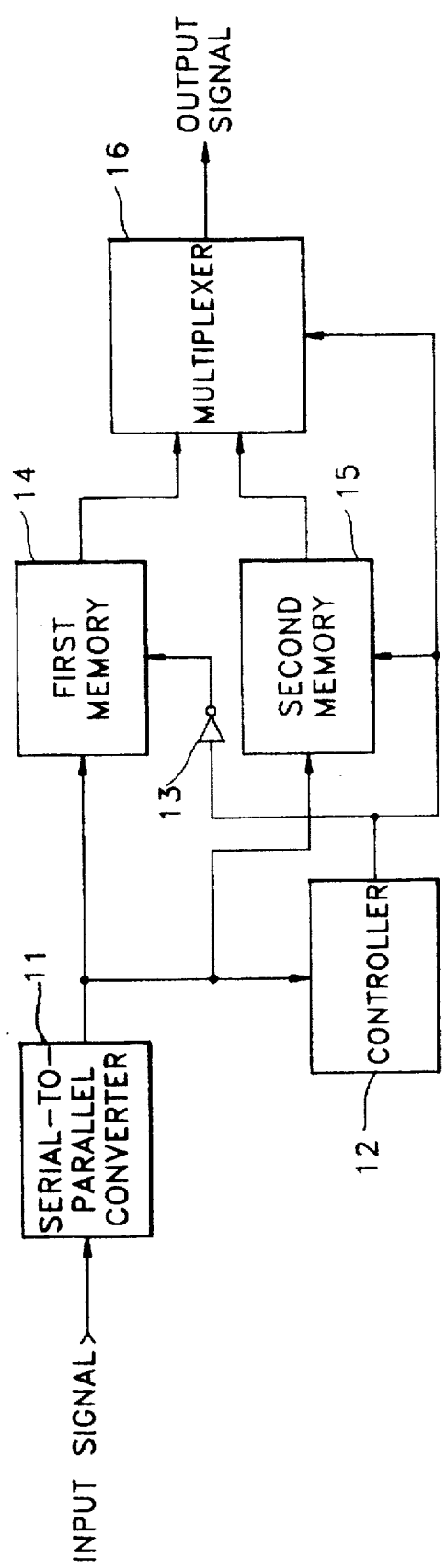
FIG. 1 is a block diagram of a modulation code encoder according to a preferred embodiment of the present invention.

Referring to FIG. 1, a modulation code encoder according to the present invention comprises a serial-to-parallel (S/P) converter 11, a controller 12, an inverter 13, first memory 14 for storing a first look-up table (LUT1), second memory 15 for storing a second look-up table (LUT2) and a multiplexer (MUX) 16.

Figure 2:
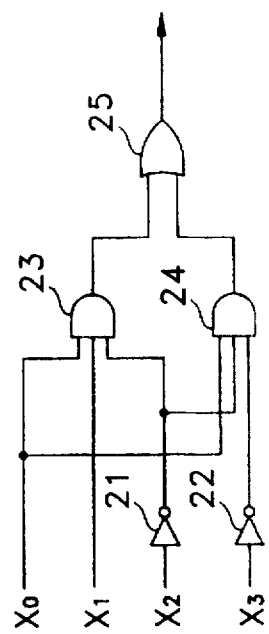
FIG. 2 is a detailed circuit diagram of the controller shown in FIG. 1.

According to FIG. 2, the controller 12 comprises two inverters 21 and 22, two AND gates 23 and 24, and an OR gate 25.

Figure 4:
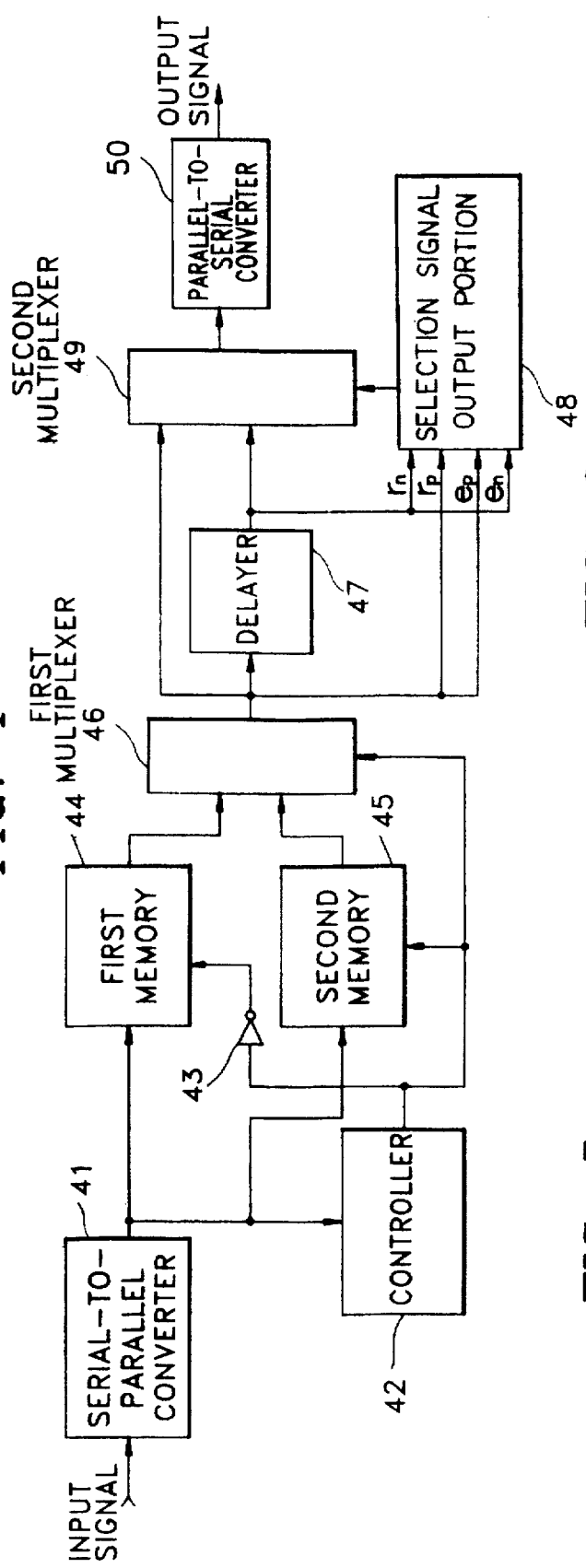
FIG. 4 is a block diagram of a modulation code decoder according to a preferred embodiment of the present invention.

Referring to FIG. 4, a modulation code decoder according to the present invention comprises a serial-to-parallel (S/P) converter 41, a controller 42, an inverter 43, first memory 44 for storing a first look-up table (LUT1), second memory 45 for storing a second look-up table (LUT2), a first multiplexer (MUX1) 46, a delay circuit 47, a selection signal output portion 48, a second multiplexer (MUX2) 49 and a parallel-to-serial (P/S) converter 50.

Figure 5:
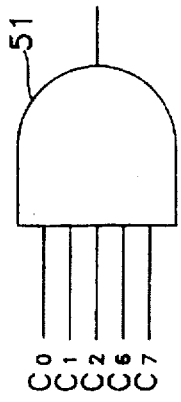
FIG. 5 is a detailed circuit diagram of the controller shown in FIG. 4.

According to FIG. 5, which illustrates the controller 42 of FIG. 4 in detail, controller 42 includes an AND gate 51 having inputs such as $c_0$, $c_1$, $c_2$, $c_6$ and $c_7$.

Figure 6:
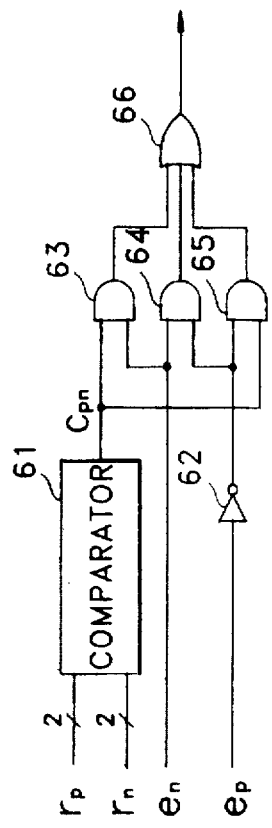
FIG. 6 is a detailed circuit diagram of the selection signal output portion shown in FIG. 4.

FIG. 6 illustrates the selection signal output portion 48 of FIG. 4 in detail. The selection signal output portion 48 includes a comparator 61, three AND gates 63, 64, and 65, and an OR gate 66.

The operation of the modulation code encoder and decoder according to the present invention will be described with reference to FIGS. 1 to 6.

The encoding ratio of the modulation code, which is capable of being implemented with hardware, should be less than the channel capacity, and particularly, the optimum modulation code uses an encoding ratio corresponding to the channel capacity. However, the modulation code is difficult to obtain when the modulation code, whose encoding ratio is close to the channel capacity, has an encoding ratio corresponding to a rational-number and has a fixed variable length coded word. Therefore, the modulation code should have an encoding ratio of an integer and a fixed length coded word.

Table 1 is a basic modulation code table. In order to encode with a (2,9) modulation code encoder using only the basic modulation code table, the (2,9) condition at a coded word border should be satisfied. As shown in Table 1, in the cases of the code No. 0 and 1, the (2,9) condition at the border is satisfied with respect to an arbitrary coded word. However, in code No. 2, the (2,9) condition at the border with respect to code No. 0 is broken and in code No. 3, the (2,9) condition at the border with respect to code No. 0 and 1 is broken.

The modulation code, when the (2,9) condition is broken at the border of the coded word, is shown in Table 2. Thus, three additional codes are required for the (2,9) modulation code encoder. The additional codes with respect to the codes breaking the border condition are shown in Table 3. The additional codes satisfy the border condition with respect to an arbitrary coded word.

TABLE 1

| Code No. | Data | Coded word |
|---|---|---|
| 0 | 00 | 1000 |
| 1 | 01 | 0100 |
| 2 | 10 | 0010 |
| 3 | 11 | 0001 |

TABLE 2

| Code No. | Data | Coded word |
|---|---|---|
| 20 | 1000 | 00101000 |
| 30 | 1100 | 00011000 |
| 31 | 1101 | 00010100 |

TABLE 3

| Code No. | Data | Coded word |
|---|---|---|
| 20 | 1000 | 00001000 |
| 30 | 1100 | 00010000 |
| 31 | 1101 | 00000100 |

In FIG. 1, the S/P converter 11 receives serial data according to a control signal, converts the serial data into parallel data and then outputs the data. When the control signal is '1' and '0,' the S/P converter 11 receives 4 bits and 2 bits, respectively.

The first and second memories 14 and 15 store the first look-up table (LUT1), which corresponds to the basic modulation code table (Table 1), and the second look-up table (LUT2) which corresponds to the additional modulation code table (Table 3), respectively.

Controller 12 determines a modulation code table to be used for encoding the parallel data output from the S/P converter 11, from either the basic modulation code table stored in first memory 14 or the additional modulation code table stored in second memory 15, and selects the input of the S/P converter 11 and the look-up table in accordance with the above determination.

When the parallel data output from the S/P converter 11 is 4 bits ($x_0 x_1 x_2 x_3$), the block which obtains the output of the controller 12 is determined by the circuit shown in FIG. 2. The output (cntl) of the controller 12 is represented by the following formula (1):

where x represents an AND operation of the AND gates 23 and 24, and x represents an OR operation of the OR gate 25.

The output of the controller 12 is supplied to the first memory 14 via inverter 13 and to the second memory 15 directly, so as to enable only one of the two memories at a time.

The multiplexer 16 selectively outputs the basic modulation coded word output from the first memory 14 or the additional modulation coded word output from the second memory 15 according to the output of the controller 12.

On the other hand, when decoding (2,9) modulation code, an 8 bit coded word is received and a 4 bit decoded word is output. Overlapped decoding, as shown in FIG. 3, is performed to prevent the propagation of an error and to partially correct the error.

Figure 3:
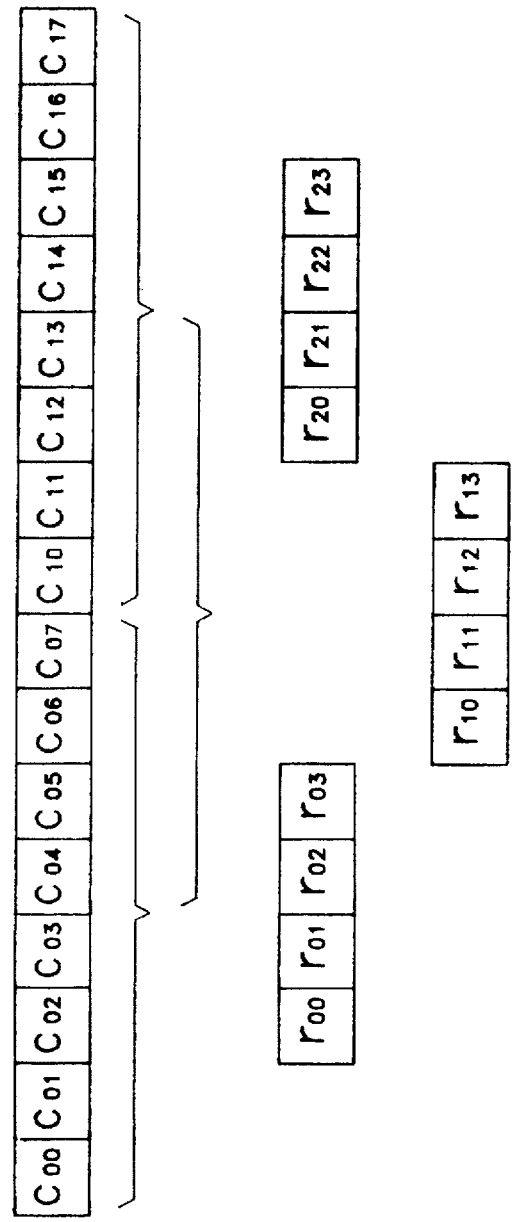
FIG. 3 is a diagram showing an overlapped decoding.

Referring to FIG. 3, C, which represents a reception bit row, is decoded and divided into 8 bit block units. Two decoded words are obtained from one decoded block. One of two decoded words from the current and next blocks is selected. Referring to Tables 1 and 2, there are two cases: one in which a decoded word exists and the other in which a decoded word does not exist. Assuming that the coded words decoded in the current and next blocks are $\gamma_p$ and $\gamma_n$, respectively, the selecting conditions of $\gamma_p$ and $\gamma_n$ are as follows:

Case 1: If $\gamma_p$ does not exist, select $\gamma_n$;
Case 2: If $\gamma_n$ does not exist, select $\gamma_p$;
Case 3: If $\gamma_p$ is equal to $\gamma_n$, select $\gamma_n$;

Case 4: If $\gamma_p$ is not equal to $\gamma_n$, select $\gamma_p$;
Case 5: If both $\gamma_p$ and $\gamma_n$ do not exist, select '00.'

In Cases 1 and 2, the current and next blocks are decoded using a basic modulation decode table and an additional modulation decode table, and in Case 3, the current and next blocks both are decoded using the basic modulation decode table. Case 4 represents a special case when an error occurs or when the coded word of code No. 3, in the additional modulation code Table 3, and the coded word of either code No. 0 or code No. 1, in the basic modulation code Table 1, are sequentially encoded. That is, in Case 4, coded words '110000' and '110001' become '000100001000' and '000100000100,' respectively. In this case, the next block is decoded at the border of the block using the additional modulation decode table. However, this decoding is an abnormal case, so that the decoded word of the previous block should be selected. In Case 5 where decoding is not performed due to the generation of an error, an arbitrary coded word may be selected. Here, for convenience, '00' is selected. By this overlapped decoding, the problem of error propagation in the (2,9) modulation code encoder and decoder is solved. That is, two decoded words in a block are compared with each other to obtain a final decoded word. Thus, even if an erroneous decoding is performed in the current block, error propagation influencing the next block can be prevented.

At this time, the operation of the modulation code decoder will be described with reference to FIG. 4.

In FIG. 4, the S/P converter 41 receives serial data, converts the serial data into parallel data of 8 bits and then shifts the parallel data by 4-bits.

The first and second memories 44 and 45 store the first look-up table (LUT1), written by the basic modulation decode table (inverse order of Table 1), and the second look-up table (LUT2), written by the additional modulation decode table (inverse order of Table 3), respectively, then output the decoded modulation code and an error flag.

The controller 42 determines a modulation decode table to be used for decoding the parallel data output from the S/P converter 41 from either the basic modulation decode table stored in the first memory 44 or the additional modulation decode table stored in the second memory 45, and selects the input of the S/P converter 41 and the look-up table in accordance with the above determination.

When the parallel data output from the S/P converter 41 is 8 bits ($c_0c_1c_2c_3c_4c_5c_6c_7$), when the input of the controller 42 is a word of the reception bit block, the output (cntl) of the controller 42 is represented by the following formula (2):
where x represents an AND operation.

That is, if the $0^{th}$, $1^{st}$, $2^{nd}$, $6^{th}$ and $7^{th}$ bits all are '0,' decoding is performed using the additional modulation decode table, otherwise, decoding is performed using the basic modulation decode table.

The output of the controller 42 is supplied to the first memory 44 via the inverter 43 and to the second memory 45 directly, so as to enable only one of the two memories at a time.

The first multiplexer 46 selectively outputs the basic modulation decoded word output from the first memory 44 or the additional modulation decoded word output from the second memory 45 according to the output of the controller 42.

The delay circuit 47 delays the output of the multiplexer 46 for a predetermined time lapse and then outputs the delayed output to the second multiplexer 49.

The selection signal output portion 48 for outputting a select signal for selecting either one of the decoded words of the current block or the next block is shown in FIG. 6.

Referring to FIG. 6, $e_p$ and $e_n$ represent the error flags of the current and next blocks, respectively. When the output of the comparator 61 is $c_{pn}$, the select signal (sel) output from the selection signal output portion 48 is as shown in the following formula (3):
where x represents an AND operation and x represents an OR operation.

The second multiplexer 49 selects one of the decoded words which are decoded at the current and next blocks according to select the signal sel output from the selection signal output portion 48.

The (2,9) modulation code encoder has limited error correction capacity wherein the error correction is performed when decoding the coded word using the additional modulation decode table with the basic modulation decode table. That is, when a single or a plurality of errors occur in the $0^{th}$, $1^{st}$, $2^{nd}$, $6^{th}$ and $7^{th}$ bits of the reception bit block, the error can be corrected. The examples of the above error correction are shown in Table 4. Furthermore, it can be seen that the error correction is performed when the additional modulation decode table is replaced by the basic modulation decode table, with reference to Tables 1, 3 and 4.

TABLE 4

| Information bit | Code bit | Reception bit | Decode bit |
|---|---|---|---|
| 1000 | 00001000 | 01001000 | 0100 |
| 1100 | 00010000 | 00010011 | 11xx |
| 1101 | 00000100 | 10000100 | 0001 |

As described above, the modulation code encoder and/or decoder according to the present invention can be applied to a magneto-optical disk, magnetic tape, and hard disk drive (HDD) in which high-density recording is required since the error correction capacity is enhanced by performing the overlapped decoding with respect to the (2,9) RLL modulation code. Particularly, the (2,9) RLL code of the present invention solves the problem of error transmission in the conventional (1,7) or (2,7) code, and has a simple hardware structure. Therefore, it can be applied to a recording and reproducing system as well as a reproduction-only system.

What is claimed is:

1. A modulation code encoder for encoding (2,9) RLL modulation code having '0's, the amount of which is at least two and at most nine, between adjacent '1's in a coded word sequence, comprising:

a serial-to-parallel converter for receiving serial data having one of 4 bits and 2 bits, according to a predetermined control signal, converting the serial data into parallel data and for outputting said parallel data;

a first memory for storing a basic modulation code table;

a second memory for storing an additional modulation code table;

a controller for outputting a selection signal for selecting one of said basic modulation code table and said additional modulation code table for encoding the parallel data output from said serial-to-parallel converter; and a multiplexer for outputting one of a basic modulation coded word, coded using said basic modulation code table, and an additional modulation coded word, coded using said additional modulation code table, in accordance with said selection signal.

2. The modulation code encoder as claimed in claim 1, wherein said first memory and said second memory are arranged as look-up tables, respectively.

3. The modulation code encoder as claimed in claim 2, wherein said basic modulation code table stored in said first memory comprises code numbers, data segments respectively corresponding to said code numbers, and coded words respectively corresponding to said data;

wherein said data segments represent a portion of said parallel data.

4. The modulation code encoder as claimed in claim 3, wherein said basic modulation code table stored in said first memory comprises code numbers having values of 0, 1, 2 and 3, wherein code number 0 corresponds to a data segment of "00", code number 1 corresponds to a data segment of "01", code number 2 corresponds to a data segment of "10" and code number 3 corresponds to a data segment of "11"; and wherein a coded word corresponding to said data segment of "00" is "1000", a coded word corresponding to said data segment of "01" is "0100", a coded word corresponding to said data segment "10" is "0010", and a coded word corresponding to said data segment "11" is "0001".

5. The modulation code encoder as claimed in claim 2, wherein said additional modulation code table stored in said second memory comprises code numbers, data segments respectively corresponding to said code numbers, and coded words respectively corresponding to said data;

wherein said data segments represent a portion of said parallel data.

6. The modulation code encoder as claimed in claim 5, wherein said additional modulation code table stored in said first memory comprises code numbers having values of "2 0", "3 0", and "3 1", wherein code number "2 0" corresponds to a data segment of "1000", code number "3 0" corresponds to a data segment of "1100", and code number "3 1" corresponds to a data segment of "1101"; and wherein a coded word corresponding to said data segment of "1000" is "00001000", a coded word corresponding to said data segment of "1100" is "00010000", and a coded word corresponding to said data segment "1101" is "00000100".

7. The modulation code encoder as claimed in claim 1, wherein said selection signal output from said controller is represented by the following formula, when the parallel data output from said serial-to-parallel converter is 4 bits $(X_0 X_1 X_2 X_3)$:

$$cntl = (X_0 \times X_1 \times \bar{X}_2) + (X_0 \times \bar{X}_2 \times \bar{X}_3)$$

where x represents an AND operation and + represents an OR operation.

8. A modulation code decoder for decoding (2,9) RLL modulation code having '0's, the amount of which is at least two and at most nine, between adjacent '1's in a coded word sequence, comprising:

a serial-to-parallel converter for receiving serial data of (2,9) RLL modulation code, converting said serial data into parallel data and shifting said parallel data by 4-bits;

a first memory for storing a basic modulation decode table and for outputting a basic modulation decoded word and an error flag;

a second memory for storing an additional modulation decode table and for outputting an additional modulation decoded word and an error flag;

a controller, coupled to said first memory and said second memory, for outputting a first selection signal to select one of said basic modulation decode table and said additional modulation decode table for decoding said parallel data output from said serial-to-parallel converter;

a first multiplexer for outputting one of a basic modulation decoded word, decoded using said basic modulation decode table, and an additional modulation decoded word, decoded using said additional modulation decode table, as a decoded word in accordance with said first selection signal;

a delay circuit for delaying said decoded word output from said first multiplexer by 1-reception bit clock period;

a selection signal output unit for outputting a second selection signal for selecting a decoded word from a next eight-bit reception bit block of decoded data output from said first multiplexer, after said decoded word is delayed by said delay circuit, and for selecting a decoded word from a current decoded eight-bit reception bit block of decoded data output from said first multiplexer;

a second multiplexer for outputting one of said decoded word delayed by said delay circuit and said decoded word from said first multiplexer, according to said second selection signal output from said selection signal output unit; and a parallel-to-serial converter for converting said decoded word output from said second multiplexer into serial output signal.

9. The modulation code decoder as claimed in claim 8, wherein said first memory and said second memory are arranged as look-up tables, respectively.

10. A modulation code decoder as claimed in claim 9, wherein said modulation code decoder is arranged to perform an overlapped decoding process.

11. The modulation code decoder as claimed in claim 9, wherein said controller received a selection bit block corresponding to said parallel data from said serial-to-parallel converter, and wherein said first selection signal output from said controller is represented by the following formula, when a word of said reception bit block supplied to said controller from said serial-to-parallel converter is 8 bits $(c_0 c_1 c_2 c_3 c_4 c_5 c_6 c_7)$:

$$cntl = c_0 \times c_1 \times c_2 \times c_6 \times c_7$$

where x represents an AND operation.

12. The modulation code decoder as claimed in claim 9, wherein the second selection signal output from said selection signal output unit is represented by the following formula, supposing that a coded word decoded at the current block and represented by $\gamma_p$ and $\gamma_n$, the error flags of the current block and the next block are respectively represented by $e_p$ and $e_n$, and the result of a comparison of $\gamma_p$ with $\gamma_n$ is $c_{pn}$:

$$sel = \bar{e}_p \times e_n + e_n \times c_{Pn} + \bar{e}_p \times c_{Pn}$$

where x represents an AND operation and + represents an OR operation.

13. A modulation code encoder/decoder for encoding (2,9) RLL modulation code having '0's, the amount of which is at least two and at most nine, between adjacent '1's in a coded word sequence and for decoding the encoded (2,9) RLL modulation code, comprising:

a first serial-to-parallel converter for receiving serial data having one of 4 bits and 2 bits, for converting said serial data into parallel data and for outputting said parallel data;

a first memory for storing a basic modulation code table;

a second memory for storing an additional modulation code table;

a first multiplexer for outputting one of a basic modulation coded word, coded using said basic modulation code table, and an additional modulation coded word, coded using said additional modulation code table, in accordance with a first selection signal;

a second serial-to-parallel converter for receiving serial data of (2,9) RLL modulation code from said first multiplexer, converting the serial data into parallel data and shifting the parallel data by 4-bits;

a third memory for storing a basic modulation decode table and for outputting a basic modulation decoded word and an error flag;

a fourth memory for storing an additional modulation decode table and for outputting an additional modulation decoded word and an error flag;

a second multiplexer for outputting one of a basic modulation decoded word, decoded using said basic modulation decode table, and an additional modulation decoded word, decoded using said additional modulation decode table, in accordance with a second selection signal;

a controller for outputting said first selection signal for selecting one of said basic modulation code table and said additional modulation code table for encoding said parallel data output from said first serial-to-parallel converter, and for outputting said second selection signal for selecting one of said basic modulation decode table and said additional modulation decode table for decoding the parallel data output from said second serial-to-parallel converter;

a delay circuit for delaying the decoded word output from said second multiplexer by 1-reception bit clock period;

a selection signal output unit for outputting a third selection signal for selecting a decoded word from an eight-bit reception bit block of decoded data output from said first multiplexer, after said decoded word is delayed by said delay circuit, and a decoded word from a current block eight-bit reception block of decoded data;

a third multiplexer for outputting one of said decoded word output from said delay circuit and said decoded word output from said second multiplexer, according to said third selection signal output from said selection signal output unit; and a parallel-to-serial converter for converting said decoded word output from said third multiplexer into a serial output signal.

* * * * *